United States Patent [19]

Frazier et al.

[11] Patent Number: 5,689,255
[45] Date of Patent: Nov. 18, 1997

[54] METHOD AND APPARATUS FOR COMPRESSING AND DECOMPRESSING IMAGE DATA

[75] Inventors: Allen L. Frazier; Brent M. Bradburn, both of Wichita, Kans.

[73] Assignee: Hewlett-Packard Company, Palo Alto, Calif.

[21] Appl. No.: 518,031

[22] Filed: Aug. 22, 1995

[51] Int. Cl.$^6$ ..................................................... H03M 7/46
[52] U.S. Cl. ..................................................... 341/63; 341/51
[58] Field of Search ..................................... 341/50, 51, 63

[56] References Cited

U.S. PATENT DOCUMENTS

| | | | |
|---|---|---|---|
| 3,726,993 | 4/1973 | Lavallee | 178/6 |
| 3,883,847 | 5/1975 | Frank | 340/146.1 |
| 4,258,392 | 3/1981 | Yamazaki et al. | 358/260 |
| 4,464,650 | 8/1984 | Eastman et al. | 340/347 DD |
| 4,543,612 | 9/1985 | Matsunaga et al. | 358/261 |
| 4,558,302 | 12/1985 | Welch | 340/347 DD |
| 4,586,027 | 4/1986 | Tsukiyama et al. | 341/63 |
| 4,626,829 | 12/1986 | Hauck | 341/65 |
| 4,631,521 | 12/1986 | El-Sherbini | 341/63 |
| 4,814,746 | 3/1989 | Miller et al. | 341/95 |
| 4,872,009 | 10/1989 | Tsukiyama et al. | 341/95 |
| 4,881,075 | 11/1989 | Weng | 341/87 |
| 4,943,869 | 7/1990 | Horikawa et al. | 358/426 |
| 4,988,998 | 1/1991 | O'Brien | 341/55 |
| 5,034,968 | 7/1991 | Willey et al. | 375/122 |
| 5,049,880 | 9/1991 | Stevens | 341/63 |
| 5,049,881 | 9/1991 | Gibson et al. | 341/95 |
| 5,126,739 | 6/1992 | Whiting et al. | 341/106 |
| 5,146,221 | 9/1992 | Whiting et al. | 341/67 |
| 5,153,591 | 10/1992 | Clark | 341/51 |
| 5,155,484 | 10/1992 | Chambers, IV | 341/55 |
| 5,177,622 | 1/1993 | Yoshida et al. | 358/429 |
| 5,179,378 | 1/1993 | Ranganathan et al. | 341/51 |
| 5,179,711 | 1/1993 | Vreeland | 395/775 |
| 5,220,440 | 6/1993 | Hisatake | 358/433 |
| 5,229,768 | 7/1993 | Thomas | 341/51 |
| 5,237,460 | 8/1993 | Miller et al. | 360/8 |
| 5,239,298 | 8/1993 | Wei | 341/51 |
| 5,245,337 | 9/1993 | Bugajski et al. | 341/51 |
| 5,282,256 | 1/1994 | Ohsawa et al. | 382/56 |
| 5,287,420 | 2/1994 | Barrett | 382/56 |
| 5,327,254 | 7/1994 | Daher | 358/426 |
| 5,339,076 | 8/1994 | Jiang | 341/51 |

OTHER PUBLICATIONS

Internet Article, Newsgroup Comp.Compression.Research FAQ. Subjects 7,8,16,70. Can be Retrieved at HTTP://WWW.LIB.OX.AC.UK/INTERNET/NEWS/FAQ/COMP-.COMPRESSION.RESEARCH.HTML (no date).

*Primary Examiner*—Marc S. Hoff
*Attorney, Agent, or Firm*—Oppenheimer Poms Smith

[57] ABSTRACT

Image data such as text or half-tone images is compressed and decompressed. A compressor has three phases: a bit-run length phase that counts the length of each run of consecutive identical pixels; a pairs-repetition phase that compresses repeated pairs of pixel run values to one copy of the repeated pair and a repeat count; and an optional dictionary-based micro-table encoder. The micro-table, which may be used in any application calling for a least recently used (LRU) mechanism, has multiple qualification layers, with elements within a qualification layer being promoted to the next higher qualification layer upon the occurrence of a table hit for that element, and being demoted to the next lower qualification layer by being bumped by elements promoted up from below. The result is a table that is weighted both by frequency and recency of hits.

8 Claims, 12 Drawing Sheets

METHOD AND APPARATUS FOR COMPRESSING AND DECOMPRESSING IMAGE DATA

BACKGROUND OF THE INVENTION

1. Field of the Invention

The present invention generally relates to the art of data compression, and more specifically to lossless image data compression and decompression.

2. Description of the Related Art

Transmission and storage of image data information is becoming increasingly important in today's computerized world. Image scanners, photocopy machines, telephone facsimile machines, and the like, digitize an image such as a sheet of printed text or a drawing and then store or transmit that image as a bitmap.

When such image data is digitized, it is desirable to compress the data to increase the throughput rate, decrease the amount of memory storage or transmission bandwidth required, increase the resolution of the stored image, or some combination of these. Because image data typically includes large amounts of redundant information, it is often possible to remove much of the redundant information, thereby reducing the number of bits required to represent the image.

Compression is the process of removing the redundant information. Decompression is the process of reconstructing the original data from the compressed data.

Existing techniques provide many useful data compression for various applications. For example, ISO/IEC Standard 11172-3, known as MPEG, is optimized to balance picture quality and compression ratio for a moving color video image. This is a "lossy" compression technique, meaning that at least in some circumstances information is lost in the encoding process, and the image cannot be reconstructed completely accurately.

A lossless compression technique, known as the "LZ" system is described by Lempel and Ziv in their paper, "A Universal Algorithm for Sequential Data Compression," IEEE Transactions on Information Theory, Volume IT-23, No. 3, May 1977. The LZ system uses fixed length code values which represent input data symbol strings of varying length.

The system attempts to use a single code value to represent as many data symbols as possible. The LZ system employs a table, variously known as a translation table, history array, or dictionary, in which blocks of code symbols are stored into the history array as they are processed. Future occurrences of the same blocks of data values are replaced by an index, which points to the location within the history table in which that block is stored.

The LZ algorithm is therefore "adaptive," yielding increasingly greater compression ratios as the history array is built up and modified. A variation on the LZ algorithm is disclosed in U.S. Pat. No. 4,881,075, issued to Weng. This system employs two translation tables, one being used to compress and decompress data, while the other is being built, so that encoding is always being performed with a full history table.

One significant disadvantage with dictionary-based encoding methods is that such techniques typically require large amounts of memory. For example, the preferred embodiment in Weng's compressor uses a dictionary with 4096 entries. The large table size is typically needed because unless a dictionary contains a large number of entries, or the input stream contains a small number of possible symbols and symbol combinations, the resulting compression ratio will be small and therefore of minimal value.

Large dictionaries, where implemented in hardware, require large amounts of memory to implement and are therefore costly in terms of both circuit real estate, search times, and dollars. Larger dictionaries implemented in software also generally suffer from longer access times.

A need exists therefore for a lossless image compression technique that achieves high compression ratios for image data, and can be implemented with a relatively small dictionary, if any.

SUMMARY OF THE INVENTION

The present invention provides a lossless data compression method and apparatus that achieves high compression ratios, requires only a small dictionary if any, and is particularly well suited to compressing image data that represents printed text, line drawings, and half-tones.

In one aspect of the present invention, an encoder has multiple coding phases, where each stage is particularly well suited for compressing the output data from the prior phase. The first phase is bit-run length coding. The input data stream is examined, and runs of consecutive values are replaced with the number of values in that run, and the compressed data passed along to a second phase for further compression.

The second phase is pairs repetition ("pairs-rep") coding. Consecutively repeating pairs of values are replaced with one copy of the repeated pairs, and a repetition count.

A further aspect of the present invention lies in the implementation of a dictionary-based encoding phase. This encoding phase forms a third and optional phase of the multiple phase encoder. In this third phase, an adaptive dictionary is used to further eliminate remaining redundancies.

Because the first two phases of encoding extract out much of the redundancies existing in the initial data stream, the dictionary can be implemented using a very small table called a micro-table, thus greatly decreasing the amount of circuitry required in a hardware implementation. The micro-table is weighted, meaning that when a new element is added to the table, the element to be pushed off the micro-table is the element of lowest priority, where priority is assigned on the basis of frequency and recency of use.

Within the overall encoder, the bit-run encoder is more than merely one type of compression mechanism. The bit-run encoder changes the nature of the data. By encoding the bitmap as its bit-run lengths, the bit-run phase produces a data stream that is usually easier to compress than the raw bitmap. Image components are resolved at the pixel level so that byte boundary positions within the bitmap are no longer important.

Many simple patterns, including solid color halftones, become encoded as a repeated pair of run counts, the first count indicating the white run length and the second indicating the black run length, or vice versa. Because the second encoding phase is optimized to compress repeated pair data, a unique synergism exists between the decoder phases. None of the three phases implemented individually is capable of achieving consistently high compression ratios.

It is the combination of these phases that produces a result that is greater than the sum of the individual phases, yielding effective compression across a wide variety of documents.

Accordingly, one feature of the present invention is to provide multiple phase encoding, with the first phase being bit-run length encoding.

Another feature of the present invention is to provide multiple phase encoding, including a bit-run compressor, a pairs-repetition compressor, and a dictionary-based compressor.

Still another feature of the present invention is to provide a multiple phase encoder, the final phase being dictionary-based compression using a very small dictionary.

Yet another feature of the present invention is to provide a micro-table having multiple tiers, wherein an element that has been repeated a number of times is given priority over an element that has been repeated a fewer number of times.

Still another feature of the present invention is to provide a simple method of updating and weighting a micro-table having multiple tiers.

These and other features and advantages of the present invention will be apparent to those skilled in the art from the following detailed description, taken together with the accompanying drawings, in which like reference numerals refer to like parts.

DETAILED DESCRIPTION OF THE INVENTION

The following discussion makes reference to a specific embodiment used for illustrative purposes. As those skilled in the art will appreciate, many of the parameters used in the following discussion, such as code word length and dictionary address range and data depth, may be changed without departing from the scope of the present invention.

I. Compression

Figure 1:
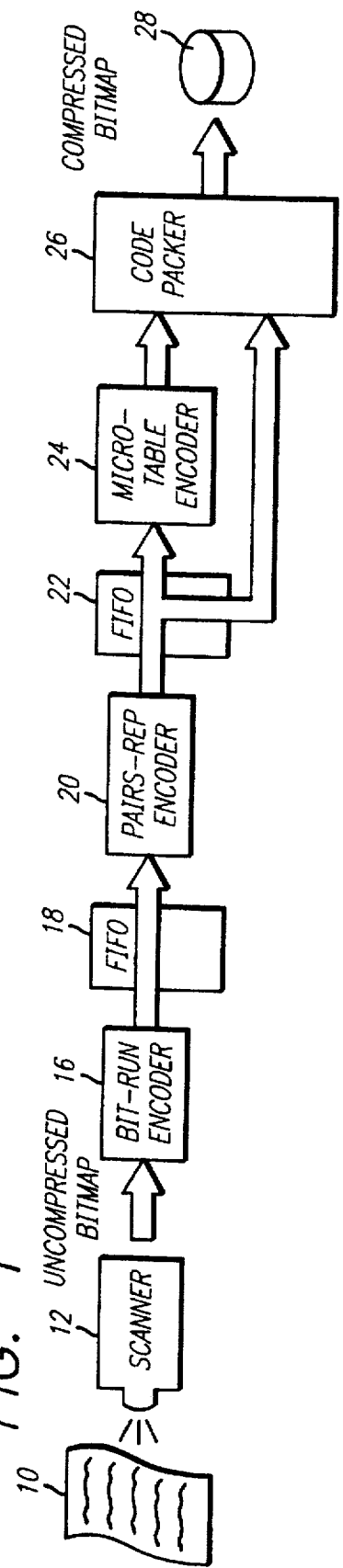
FIG. 1 is an overall block diagram of the image data compressor of the present invention.

FIG. 1 presents an overview of a data compressor according to the present invention. A scanning device 12 (not part of the present invention) scans an image 10 and converts the image into a stream of raw image data. The scanning device may be a hand-held scanner such as used with personal computers, or may be embedded in a facsimile machine, photocopier, or the like.

The raw image data is compressed using a bit-run length compression algorithm implemented in a bit-run compressor 16; further compressed using a pairs-repetition compression algorithm implemented in a pairs-rep compressor 20; and, optionally, further compressed using a dictionary-based micro-table compression algorithm in a micro-table compressor 24. Where the compressor is implemented in hardware, optional First-In-First-Out (FIFO) memories 18 and 22 are used to pass data between successive compression phases.

The FIFOs increase throughput by eliminating latencies between successive compression phases. Where the compressor is implemented in software, FIFO_top and FIFO_bottom pointers emulate FIFO operation. Code packer 26 switches either pairs-rep data, or pairs-rep data further compressed by the micro-table, to the output depending on which is the denser.

The compressed output data may be stored into permanent memory such as magnetic hard disk 28, stored into temporary memory such as RAM, or transmitted to a remote location. The benefits of compressing the data may be correspondingly realized as smaller memory requirements or shorter transmission times.

Figure 2:
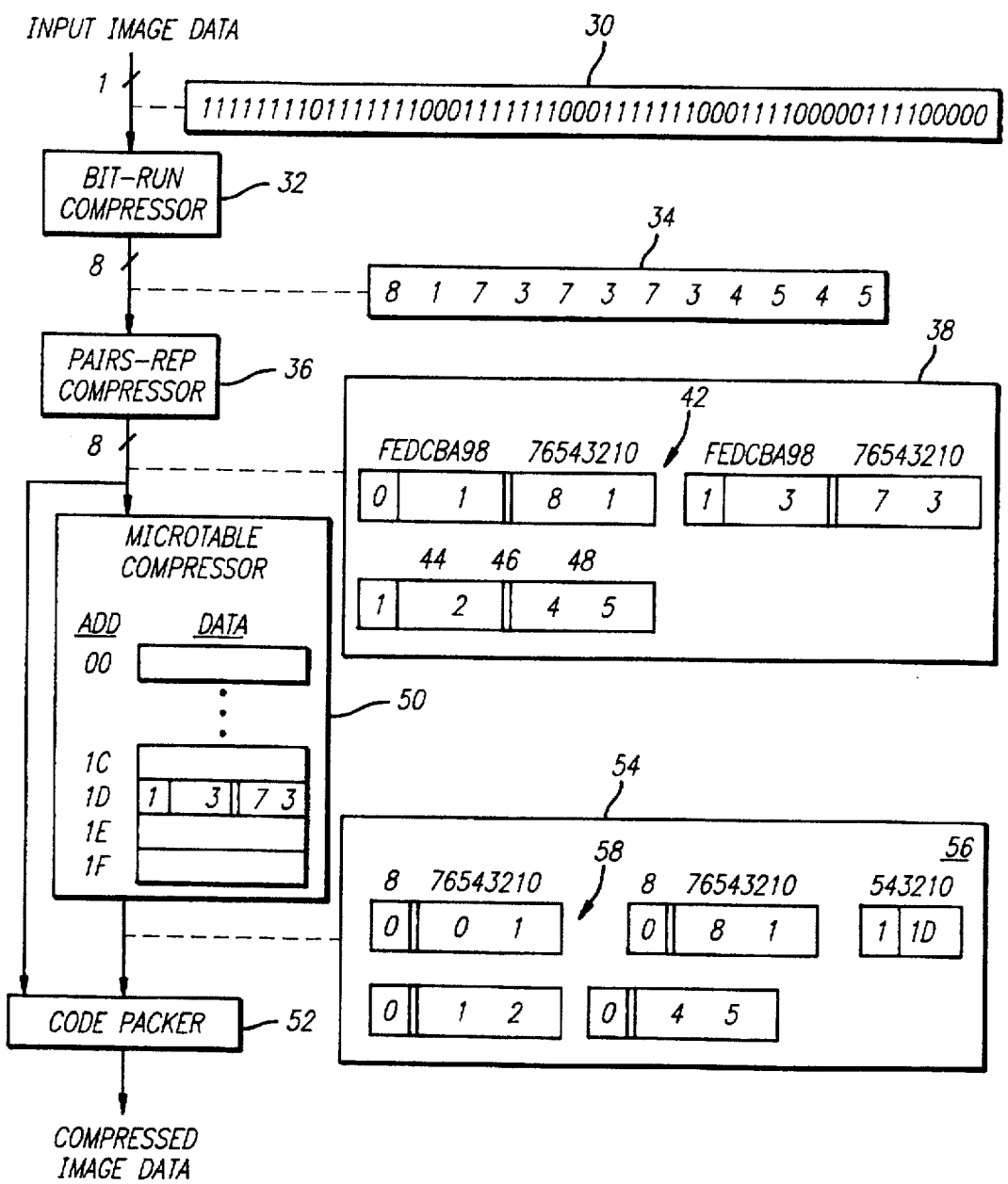
FIG. 2 is an example of the encoding process according to one illustrative embodiment of the present invention.

FIG. 2 illustrates how the image data is compressed at each phase in the compression process in the preferred embodiment. Data representing a scanned image comprises binary data stream 30, with "0" representing white bits and "1" representing black bits, or vice versa. When the scanned image is a printed page containing text or line drawings, data stream 30 will contain large runs of consecutive 1's or consecutive 0's.

A. Bit-Run Compression

Bit-run compressor 32 counts the length of each run and generates a data stream 34 that is a series of run length values. The polarity of each run is the opposite of the previous run's polarity. In the preferred embodiment, run values are encoded as nibbles (4 bits).

However, as those skilled in the art will appreciate, run-length values could alternatively be represented as bytes (8 bits), words (16 bits), long words (32 bits), or any length desired to achieve the best compression ratio for the particular data to be compressed. Longer run length values may be more suitable for a particular implementation such as processing high resolution (e.g., 1200 dots per inch) data. Conversely, short run length values will more efficiently encode data which contains only short runs.

In the preferred embodiment, 4-bit values are used. Nibble values of 1 to 15 indicate run lengths of 1 to 15, respectively. A nibble value of 0 indicates a partial run length of 15 in the current polarity and that the run is continued in the following nibble. Thus, runs equal to or longer than 16 bits are encoded by outputting a nibble value of zero for each 15 bits of the run, followed by a final nibble with a value between 1 and 15 that indicates the remaining run length. The following table shows examples of bit-run encoding.

TABLE 1

| Bit-Run Length | Nibble Encoding |
| --- | --- |
| 1 | 1 |
| 15 | F |
| 16 | 01 |
| 30 | 0F |
| 31 | 001 |

The following table illustrates how a stream of raw pixel data is encoded by the bit-run length compressor.

| Bit-Run Length Compression | | | | | | | | | | | | |
| --- | --- | --- | --- | --- | --- | --- | --- | --- | --- | --- | --- | --- |
| Input data stream | 1111111101111111000111111100011111110001111000001111100000 | | | | | | | | | | | |
| Compressed string using nibbles | 1000 | 0001 | 0111 | 0011 | 0111 | 0011 | 0111 | 0011 | 0100 | 0101 | 0100 | 0101 |
| Decimal representation | 8 | 1 | 7 | 3 | 7 | 3 | 7 | 3 | 4 | 5 | 4 | 5 |

In FIG. 2, input data stream 30 will be encoded as shown in bit-run length compressed stream 34.

Figure 13:
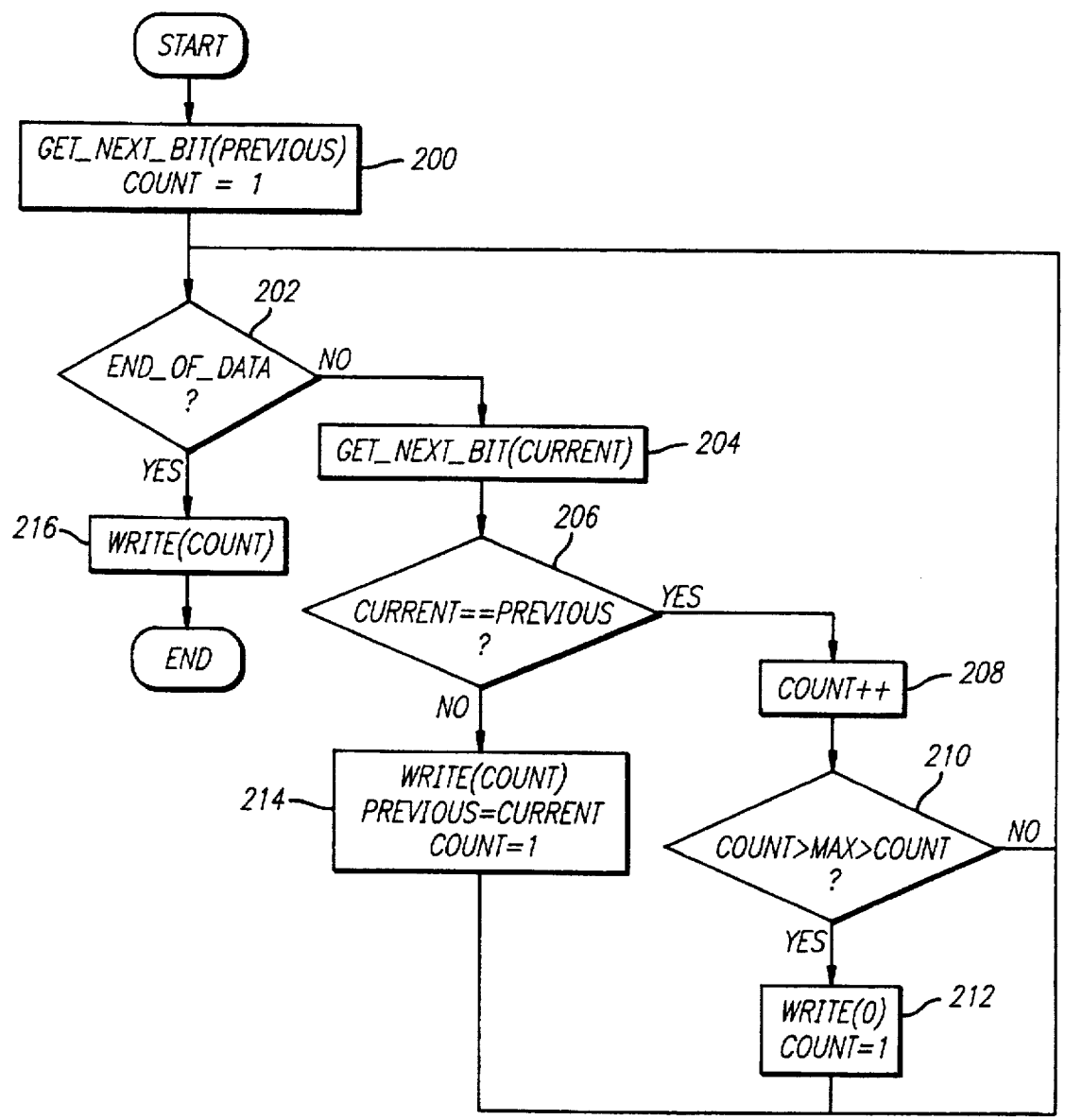
FIG. 13 depicts a software implementation of a bit-run compression phase.

FIG. 13 depicts the software implementation of the bit-run encoder. A first bit is read at block 200, and the bit-run count is set to 1. At block 202, if the data bit is not the last bit in a transmission or record, then the next bit is read in at block 204. If the bits are the same, as determined by block 206, the run count is incremented at block 208. If the run count is less than the maximum (the maximum being 15 in the preferred embodiment), then unless the end of the data has been reached at block 202, the next bit is read in at block 204 again.

On the other hand, if the count exceeds the maximum permissible count, then the count is reset to 1 and a "0" is written to the output, denoting that the run count exceeds 15. If the bits compared at block 206 were different, then the run has come to an end, the current count is written to the output, the count is reset to 1, and the bit fetch and count process is begun again. When the end of a data transmission or record is encountered at block 202, the run count up to that point is output at block 216 and the bit-run encoder is finished.

In the preferred embodiment using nibble values, the maximum run that can be compressed into a 4-bit code value is 15 bits. Therefore, the maximum compression ratio achievable in this first phase is 15:4, or 3.75:1. Even if larger codes were used to store the run counts consistently good ratios could not be expected. To improve on bit-run compression a second compression phase is added.

B. Pairs-Rep Compression

The second compression phase is a pairs-repetition (pairs-rep) compressor 36. It compresses repeating pairs of bit-run codes. There are various specific encoding schemes that could be used for the pairs-rep phase. In the preferred embodiment, pairs-rep compressor 36 identifies repeating patterns and encodes them with a repeat count specifier and one copy of the repeating values. Any data that is not encoded as part of pairs-repetition is left unchanged.

| Pairs-Rep Compression | | | | | | | | | | | | |
| --- | --- | --- | --- | --- | --- | --- | --- | --- | --- | --- | --- | --- |
| Bit-Run data | 8 | 1 | 7 | 3 | 7 | 3 | 7 | 3 | 4 | 5 | 4 | 5 |
| Pairs-Rep Compressed Data | 1 8 1 | | | 3 7 3 | | | | | 2 4 5 | | | |

Output 38 of pairs-rep compressor 36 is organized into bytes. Each byte is either a code or data. The first byte must be a code. Each code indicates how many bytes of data follow it. When the data for a code has been exhausted, another code value is output. The high order bit of a code indicates its type and the low order 7 bits indicate a count. If the type bit is clear, then the count indicates the number of literal (unpaired) data bytes to follow.

For example, in data stream 38 in FIG. 2, the first 2-byte word contains the following information: a 0 bit in type field 44 denotes that the data to follow will be a literal; the value of 1 in the count field 46 denotes that the literal data will be one byte long (two nibbles); and the value of 81 (hex) in data field 48 represents the run-length data (8 bits of one polarity, followed by 1 bit of the opposite polarity).

In scanned text, blank horizontal scan lines and margins appear as long strings of consecutive white bits. These will be encoded by the bit-run encoder as a series of nibble values equal to 0, as illustrated in Table 1. These data will be further encoded by the pairs-rep encoder as a series of blocks, each block containing the values "7F 0 0" (hex). The 7-bit value "7F" denotes 127 repetitions, and the "0 0" denotes 15 white and 15 more white. Each block of 16 bits will therefore represent 127×30=3810 consecutive white pixels, yielding a maximum compression ratio of 3810:16 (238:1).

Figure 14:
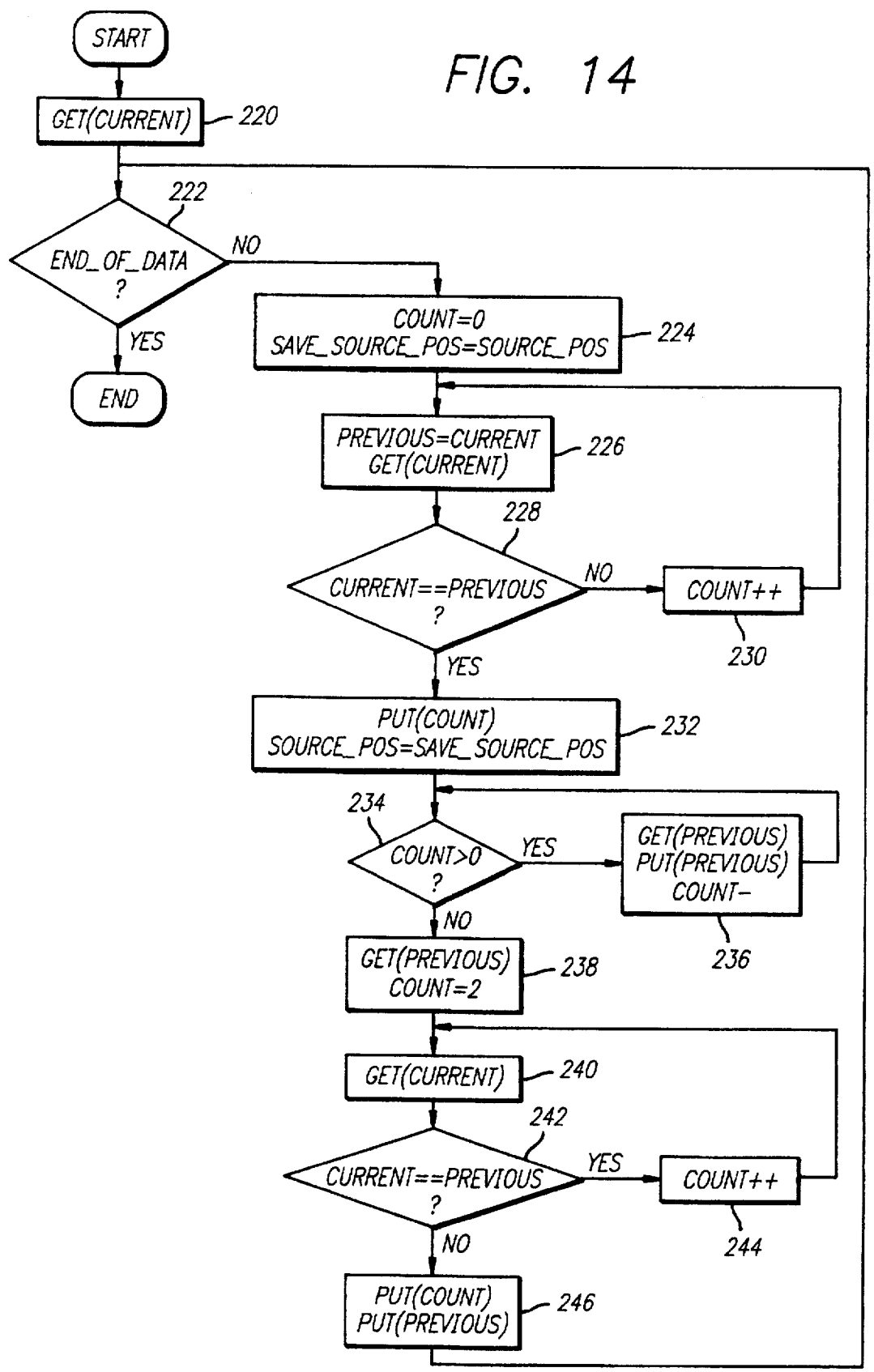
FIG. 14 depicts a software implementation of a pairs-rep compression phase.

FIG. 14 depicts the software implementation of the pairs-rep encoder. At block 220, the first byte is read in from the previous (bit-run) phase. If this byte is not the end of the transmission or record, then pairs count is set equal to zero at block 224. Blocks 226, 228, and 230 together count the number of non-repeating bytes in the data stream; control falls out of this loop only when two identical consecutive bytes are detected by block 228.

Once that happens, the non-repeating byte count (literal count) is output at block 232, and the literals are repeatedly shifted out at block 236 until the literal stream is exhausted, as determined by block 234. Once the literals have been shifted out in response to a repeated byte having been detected at block 228, then the repeat count is set to 2 at block 238, and the number of times the byte is repeated is counted in the loop consisting of blocks 240, 242, and 244.

As soon as block 242 detects that the byte (nibble pair) has ceased repeating, then the repeat count and corresponding nibble pair is output at block 246, and the process begun over again, until block 222 detects that the end of the transmission or record has been encountered.

Although the first two phases will have eliminated much of the redundancy in the scanned data, some redundancy will remain in many cases.

C. Micro-Table Compression

The third compression phase, the micro-table dictionary encoder 50 (FIG. 2), is used to seek out redundancies that remain after the bit-run and pairs-rep phases are completed. The data passed to the final phase will not be very compressible. The key to success in this third phase is to compress the portions of the data that can be compressed without expanding the portions that are not compressed.

Because the final compression phase will be operating on data that is already compressed, the amount of data operated on is therefore smaller, thus reducing the requirements for this final phase. Less speed is required since the third phase will operate on less data. Furthermore, only a small compression ratio is needed to achieve a good overall compression ratio, because the ratio of the third phase will be multiplied by the ratio of the prior two phases.

For example, if the prior two phases achieve a 5:1 compression, then a mere 2:1 compression in the third phase will produce an overall system compression of 10:1. This allows the table to be implemented in hardware at a cost much less than if the table had to operate on raw, uncompressed data.

Micro-table 50 works by storing data patterns that were encountered in data stream 38. When a pattern match occurs between data stream 38 and a string previously stored in micro-table 50, micro-table 50 outputs a code with a "1" in its most significant bit (MSB) position, and the remaining bits representing an index into micro-table 50 where that pattern was previously stored.

In the example depicted in FIG. 2, micro-table 50 contains $2^5=32$ locations of 16 bits each. Code 56 consists of 6 bits: a 1-bit flag in the MSB position and 5 remaining index bits. When there is no pattern match between the data stream and the table, a 9-bit value 58 is output with a "0" in its MSB position indicating a literal, and the remaining 8 bits equal to the literal data. In FIG. 2, the pattern 3,7,3 had been previously encountered and stored at location 1D (hex) within the micro-table, so when that pattern is encountered again the micro-table compressor replaces that pattern with the index value 1D in output code 56.

As discussed above, where a line of the image being scanned is all white, a single 16-bit block of data from the pairs-rep encoder will represent 3810 all white bits. This 16-bit block of data will be further compressed by the micro-table into a 6-bit code word, yielding a maximum overall compression ratio of 3810:6 (635:1) for blank lines.

The table is considered a weighted Most Recently Used (MRU) table. It stores the patterns that have occurred most recently and removes patterns that have not occurred recently. The mechanism is weighted such that the frequency of a pattern's occurrence is taken into consideration. A pattern that occurred more than once will be kept in the table longer than a pattern that occurred only a single time. It is this weighted MRU mechanism that allows the encoder to work with a very small number of table entries. The micro-table is maintained in such a way that entries that are frequently used are given priority over entries that are not frequently used when removing an entry from the table to make room for a new entry.

1. Single Qualification Layer

Figure 3:
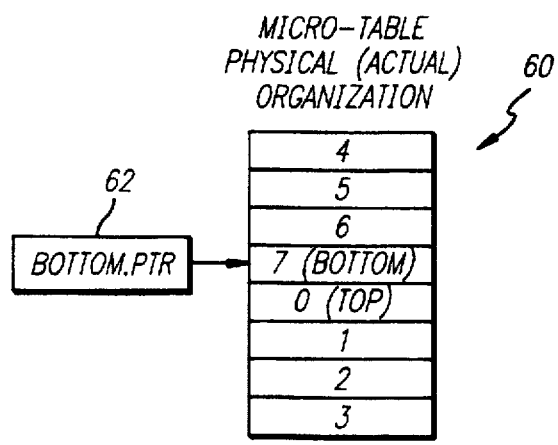
FIG. 3 illustrates the physical organization of a single-tier micro-table according to the present invention.
Figure 3A:
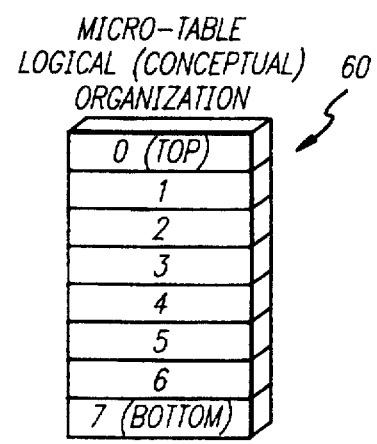
FIG. 3A illustrates the logical organization of the micro-table of FIG. 3.

Micro-table 50 can be constructed in various ways. A first and simpler micro-table embodiment, having only a single qualification layer, is shown in FIGS. 3 to 5B. FIG. 3 shows the micro-table physical (actual) organization, and FIG. 3A shows the logical (conceptual) organization. Referring to FIG. 3, micro-table 60 is comprised of a stack having eight locations. A stack pointer bottom_ptr 62, implemented in either software or hardware, contains an index into the stack.

The location pointed to by bottom_ptr 62 is defined as the logical bottom of the stack, with the physical bottom wrapping around to the physical top of the stack. Incrementing bottom_ptr 62 has the logical effect of shifting the stack downward, with the bottom value being bumped off the bottom and placed onto the top.

Table Hit

Figure 4:
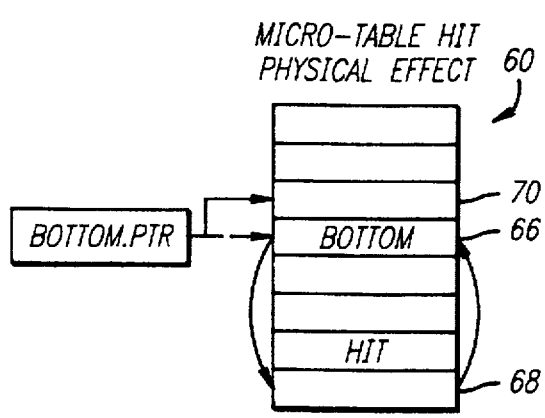
FIG. 4 illustrates the physical effect of a micro-table hit.
Figures 4A, 4B:
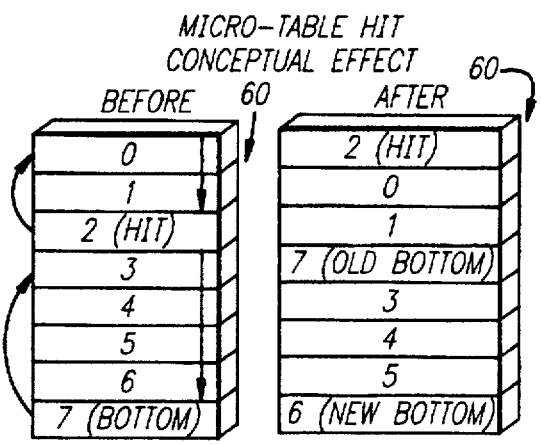
FIG. 4A illustrates the logical organization of the micro-table of FIG. 4 before a micro-table hit.
FIG. 4B illustrates the logical organization of the micro-table of FIG. 4 after a micro-table hit.

Referring to FIG. 4, when a search of the table results in a match (table hit), hit element 68 is moved to the logical top of the table to indicate that it is the most recently used. This is accomplished physically by performing a swap of hit element 68 with the element pointed to by bottom_ptr 62, then incrementing bottom_ptr 62. Referring to FIG. 4A, the logical effect of incrementing bottom_ptr 62 is that the data in the location it previously pointed to—in this case the hit element 68 (after the swap)—becomes the new logical top element. Advancing bottom_ptr 62 also has the effect of decreasing the priority of every other element in the table.

The one aspect of this mechanism that differs from pure least recently used (LRU) functionality is that, as a result of the swap operation, whatever element was previously at the logical bottom of the table is moved up to fill the slot vacated by the hit element, which was moved to the logical top. The effect of this is that, for every table hit, the elements in the table below the hit element will be cycled.

The element at the bottom of the table will, at any given time, not necessarily be the least recently used. However, while the bottom element can artificially have its priority boosted by a large amount, other elements will only decrease in priority at a rate of one element per table access. As long as an element is frequently hit, it will never reach the bottom of the table.

Alternatively, this mechanism can be enhanced by handling hits very near the top of the micro-table specially. For example, if a hit occurs on the top element no action is needed, and if a hit occurs on the second element all that is needed is a swap of the first two elements to move the second element to the top. Handling these as special cases may serve to improve the functionality of the micro-table in cases where the bottom element would have been moved to very near the top.

Table Miss

Figure 5:
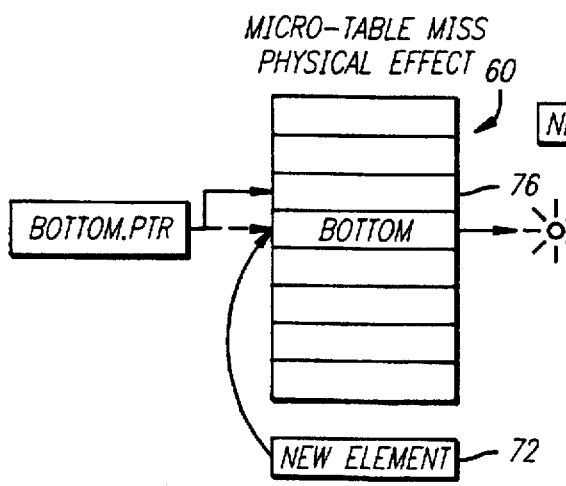
FIG. 5 illustrates the physical effect of a micro-table miss on the micro-table of FIG. 4.
Figure 5A:
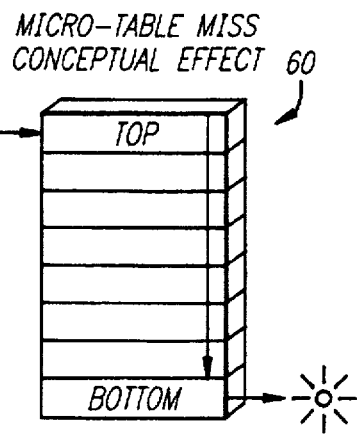
FIG. 5A illustrates the conceptual effect of a micro-table miss on the micro-table of FIG. 4.

The physical and logical effects of a table miss are shown in FIGS. 5 and 5A, respectively. When a search of the table does not result in a match (table miss) the new (search) element 72 is inserted at the logical top of the table and the element 74 at the bottom of the table is removed to make room for it. This is accomplished physically by replacing the element 74 pointed to by bottom_ptr 62 with new element 72, then adjusting bottom_ptr 62 to point to the next higher priority element 76. Just as it does on a table hit, advancing the position pointed to by bottom_ptr 62 makes hit element 72, which replaced bottom element 74, the new top and decreases the priority of all the other elements.

When adding a new element to the micro-table as the result of a miss, the MRU mechanism employed functions the same as a LRU mechanism. Although the micro-table could be implemented using a LRU mechanism, with very similar results, using the MRU mechanism disclosed is considerably more efficient, especially when the encoder is implemented in software. The recently used pattern preservation characteristics of the MRU mechanism makes it useful as a compression dictionary in its own right. However, extending the MRU mechanism, as disclosed below, results in even greater utilization of a very small amount of table space.

2. Multiple Qualification Layers

Figure 6:
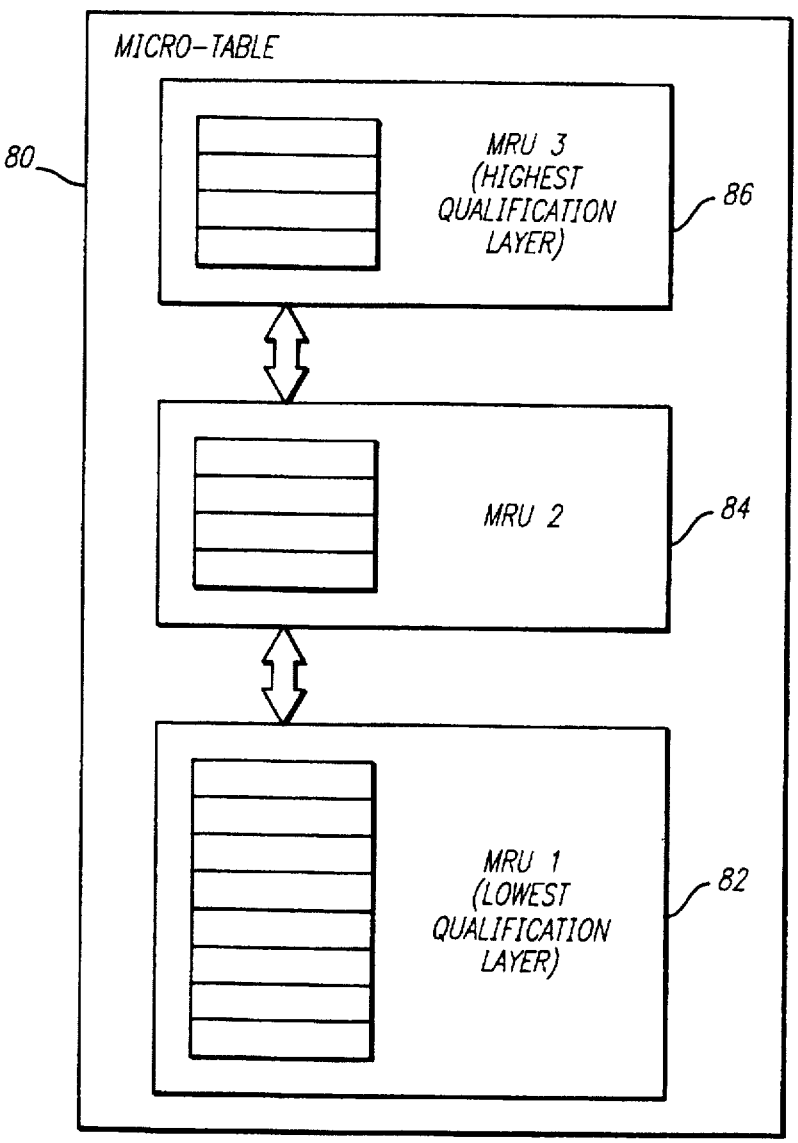
FIG. 6 illustrates a micro-table having three tiers.

A second micro-table embodiment, having multiple qualification layers, is shown in FIG. 6. This embodiment represents an extension of the MRU mechanism that results in even greater utilization of a very small amount of table space. A qualification layer is simply a section (tier) of the table which is given a separate qualification status (weight). Micro-table 80 is composed of multiple tiers which are stacked one on top of the other where the bottom tier is given the lowest qualification status and each subsequent tier has a greater status than the one below it.

In the preferred embodiment, micro-table 80 is divided into three qualification layers. Top layer 86 and middle layer 84 each contain 8 locations, and bottom layer 82 contains 16 locations, for a total of 32 locations. Each tier of the micro-table 80 is maintained as a separate MRU mechanism. An element within a tier is promoted to the next higher tier when a "hit" of that element occurs. An element is demoted to the next lower tier by being bumped off, as a result of other elements being promoted up to its level.

For purposes of the discussion below, references to searching micro-table 80 refer to the collective table. In other words, each element in each tier of micro-table 80 is searched for the target pattern until either the pattern is found or all of the elements in all of the tiers 82, 84, and 86, have been checked.

When, as a result of a table search, a match is found, the hit element is removed from its current position and inserted at the top of the next higher tier using the MRU add process previously described. The element removed from the bottom of the higher tier is placed in the original tier of the hit element using one of the following two methods.

Table Hit

Figure 7:
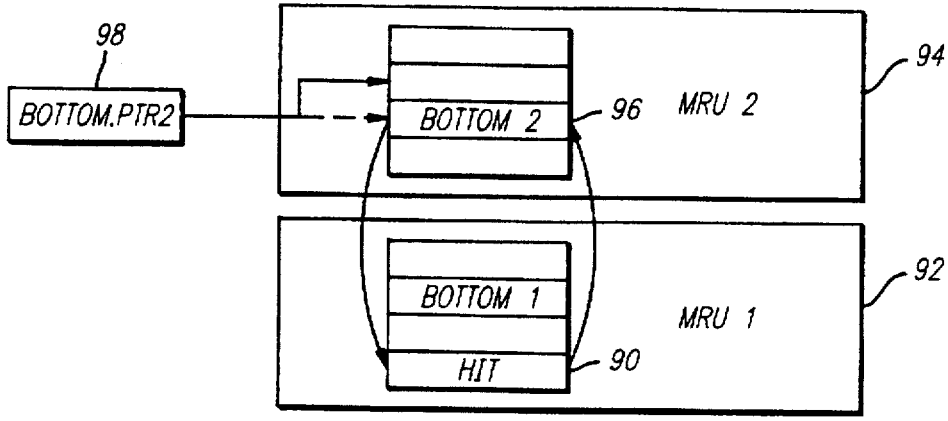
FIG. 7 illustrates the physical effect of a micro-table hit on a multiple-tiered micro-table, according to a simple swap micro-table update technique.
Figure 8:
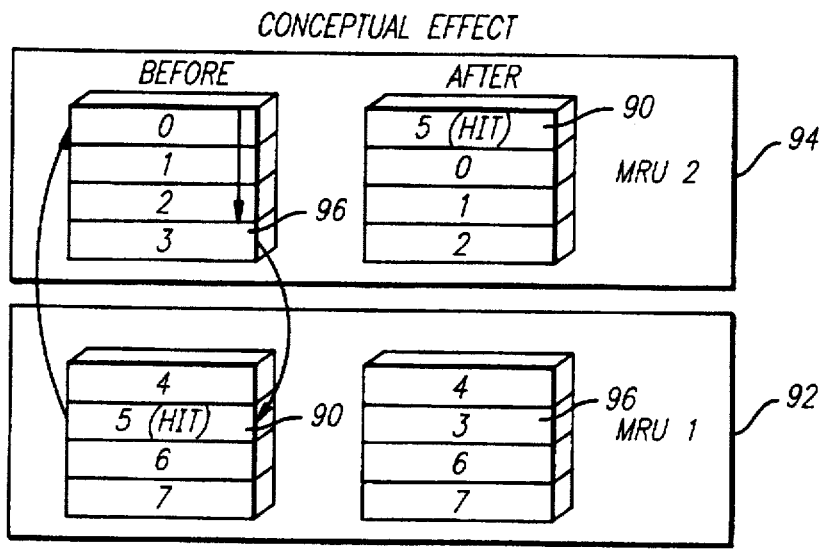
FIG. 8 illustrates the conceptual effect of the micro-table hit illustrated in FIG. 7.

FIGS. 7 and 8 illustrate a first (simple swap) method. Referring to FIG. 7, physically when a hit occurs, matched element 90 within lower tier 92 is swapped with bottom element 96 within higher tier 94, and the higher tier's bottom_ptr 98 is incremented.

Referring to FIG. 8, conceptually when a hit occurs, hit element 90 within lower tier 92 is moved up to the top of higher tier 94, and all the remaining elements within upper tier 94 bumped down by one position; what had been the bottom element of higher tier 94, after being bumped off the higher tier, gets put into the position within the lower tier that was vacated by hit element 90. One advantage to the single swap method is that it is easy and simple to implement.

Figure 9:
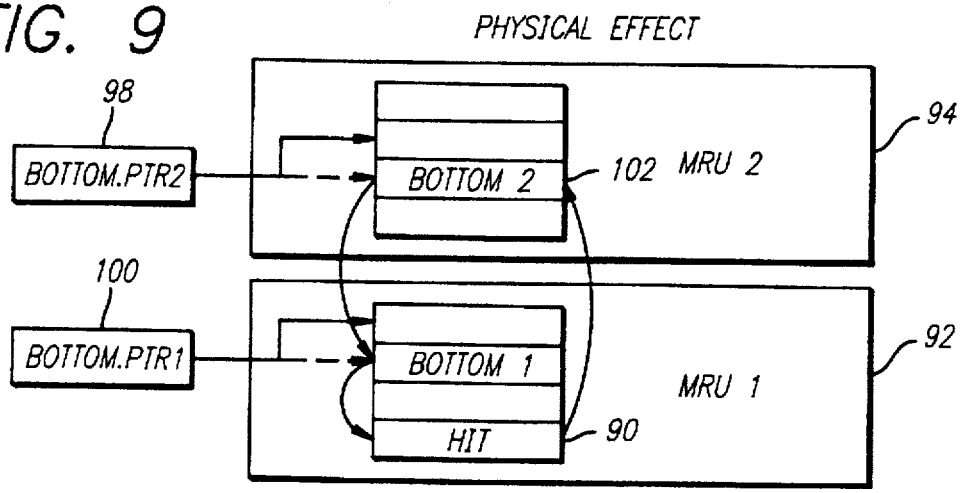
FIG. 9 illustrates the physical effect of a micro-table hit on a multiple-tiered micro-table, according to a move-to-top micro-table update technique.
Figure 10:
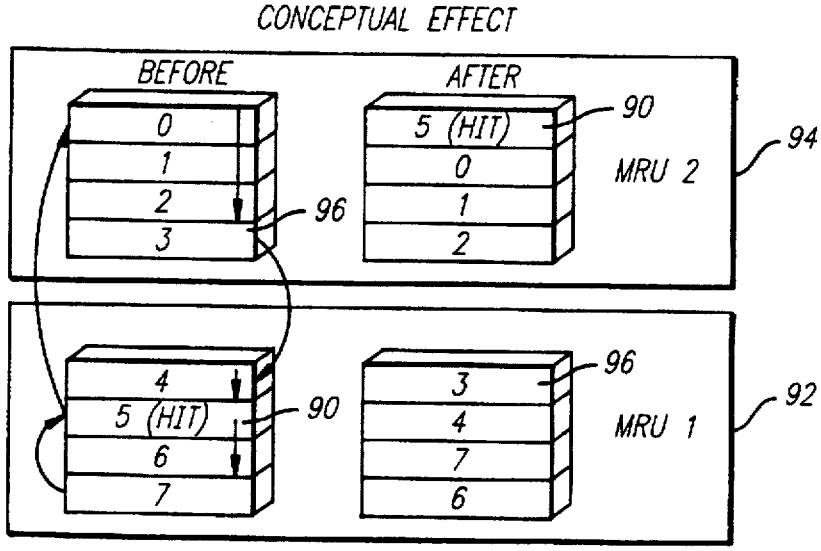
FIG. 10 illustrates the conceptual effect of the micro-table hit illustrated in FIG. 9.

FIGS. 9 and 10 illustrate a second (move-to-top) method. Referring to FIG. 9, physically when a hit occurs, hit element 90 is moved into the bottom spot of higher tier 94; element 102 removed from the bottom of higher tier 94 is inserted at the top of the lower (hit) tier 92; the spot vacated by the hit element 90 is replaced by the logical bottom element of the same tier 92; and both bottom_ptrs 98 and 100 for the two tiers are incremented.

Referring to FIG. 10, conceptually this move-to-top comprises the following steps: hit element 90 is moved to the top of the next higher tier 94, bumping down all elements within that tier; and the element 96 that had been at the bottom of upper tier 94 gets bumped off the bottom and moved to the top position of tier 92. Conceptually, this can be thought of as performing the previously described simple swap method followed by a MRU update of the original tier to move the value from the hit position (now the element from the bottom of the higher tier) to the logical top of the original tier.

When a match is found in the highest tier of the micro-table, a MRU update can be performed to move the hit element to the top of that tier. Alternatively, the encoder may perform no action at all, leaving the micro-table unchanged simply because the hit element is already in the highest tier and the exact position within that tier is of limited importance.

Table Miss

When a search of the micro-table does not result in a match (i.e., the target pattern is not in any tier of the table), the target pattern is simply added to the bottom tier using the MRU add operation.

Figure 15:
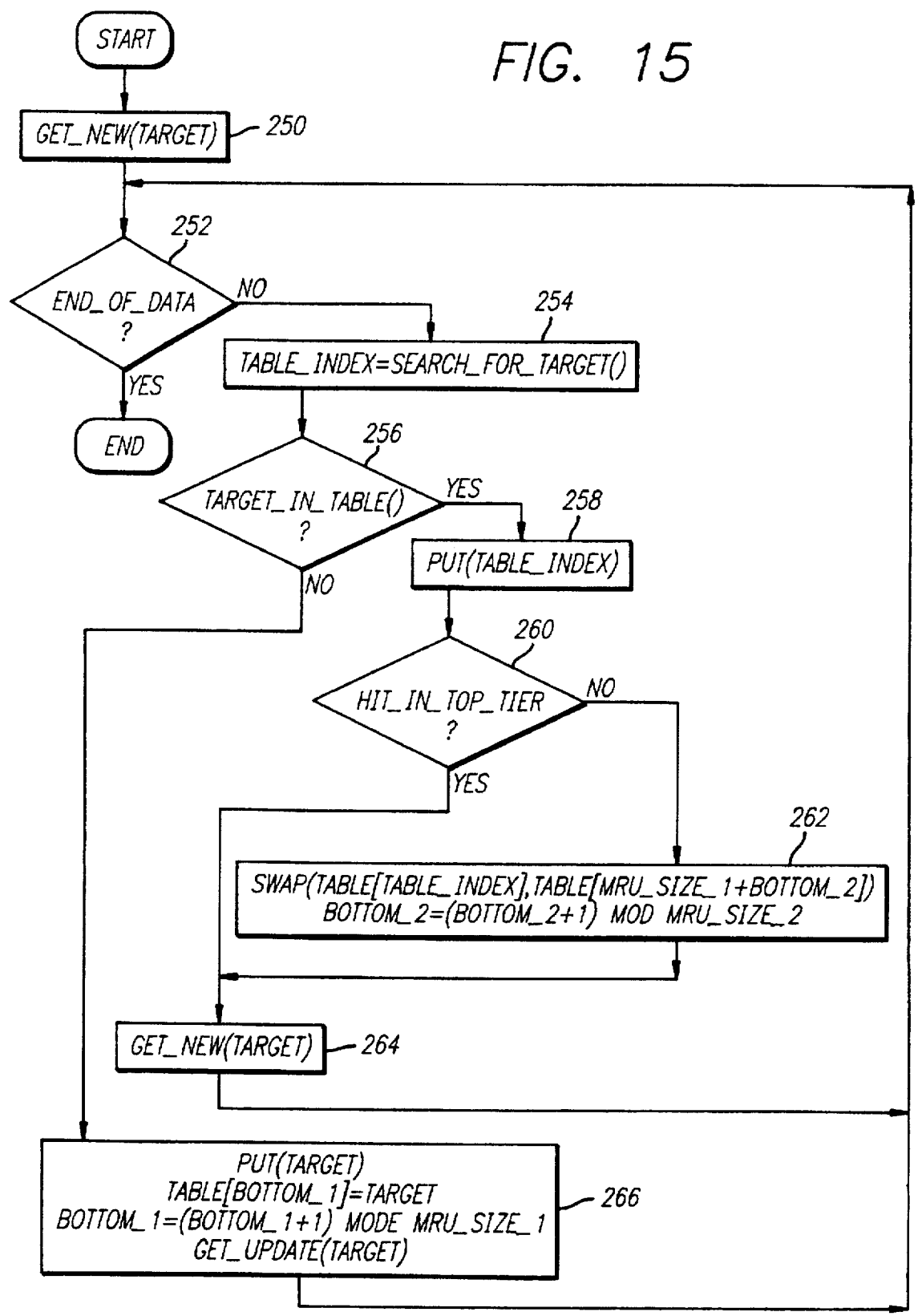
FIG. 15 depicts a software implementation of a micro-table compression phase.

FIG. 15 depicts the software implementation of a micro-table encoder having two tiers. A first 16-bit symbol from the pairs-rep encoder is read in at block 250. If this symbol is not the end of the transmission or record, then a micro-table search is conducted at block 254 to determine whether this symbol has previously been stored in the micro-table dictionary. If the symbol is found within the micro-table, then the table index pointing to that symbol is output at block 258.

If the table hit occurred in a lower tier, then a multi-tier table hit update operation is performed at block 262; otherwise, the table is left unchanged. If the symbol is not found in the table at block 256, then the symbol (literal) is output directly and a table miss update operation is performed at block 266.

The effect of using a multi-tiered micro-table is as follows. Each time an element is hit and moved up to the next higher tier it becomes more entrenched in the micro-table, i.e., more heavily weighted. Because of the multiple tiers, an element can not be removed as a result of simple disuse. An element which has climbed into the upper tiers of the micro-table will only be removed if some other element reaches the same level and replaces it.

When the micro-table encoder encounters a long series of unencodable data it adds an element to its bottom tier for each input pattern. As long as none of the patters are hit again, none of them will climb to higher tiers of the table. This is how patterns which have reached the higher tiers are preserved even if they have not been hit recently. An important and useful result is that bursts of unencodable (single-occurrence) data can not displace patterns in the upper tiers of the micro-table. Likewise, data which occurs only twice and therefore reaches the second tier can not displace patterns in the third tier.

Because the encoder uses such a small table, it is important that the quality of patterns stored in the table (with respect to the input data) makes up for the lack of quantity. Using the MRU mechanism provides for a good degree of quality in the patterns and storing the data in multiple tiers reduces the ability of low-occurrence patterns to replace the more useful patterns in the micro-table.

One advantage of using a small table is that the hardware required to implement it will be inexpensive relative to a larger table. A secondary benefit is that since there are fewer table entries, the table can be indexed by a small register. Likewise, the index, which is used as the code in the compressed data stream, will contain a small number of bits. This translates into a compact encoding scheme, i.e., good compression.

There are various possible ways to search the micro-table. When the micro-table is implemented in hardware, one method is simply to sequentially enable each table location output onto a common bus, and compare that value to the search value. This is slow. A much faster method, albeit one requiring a more complex architecture, is to implement a hardware comparator for each table location, with the search value being compared to every location within the table simultaneously.

Figure 11:
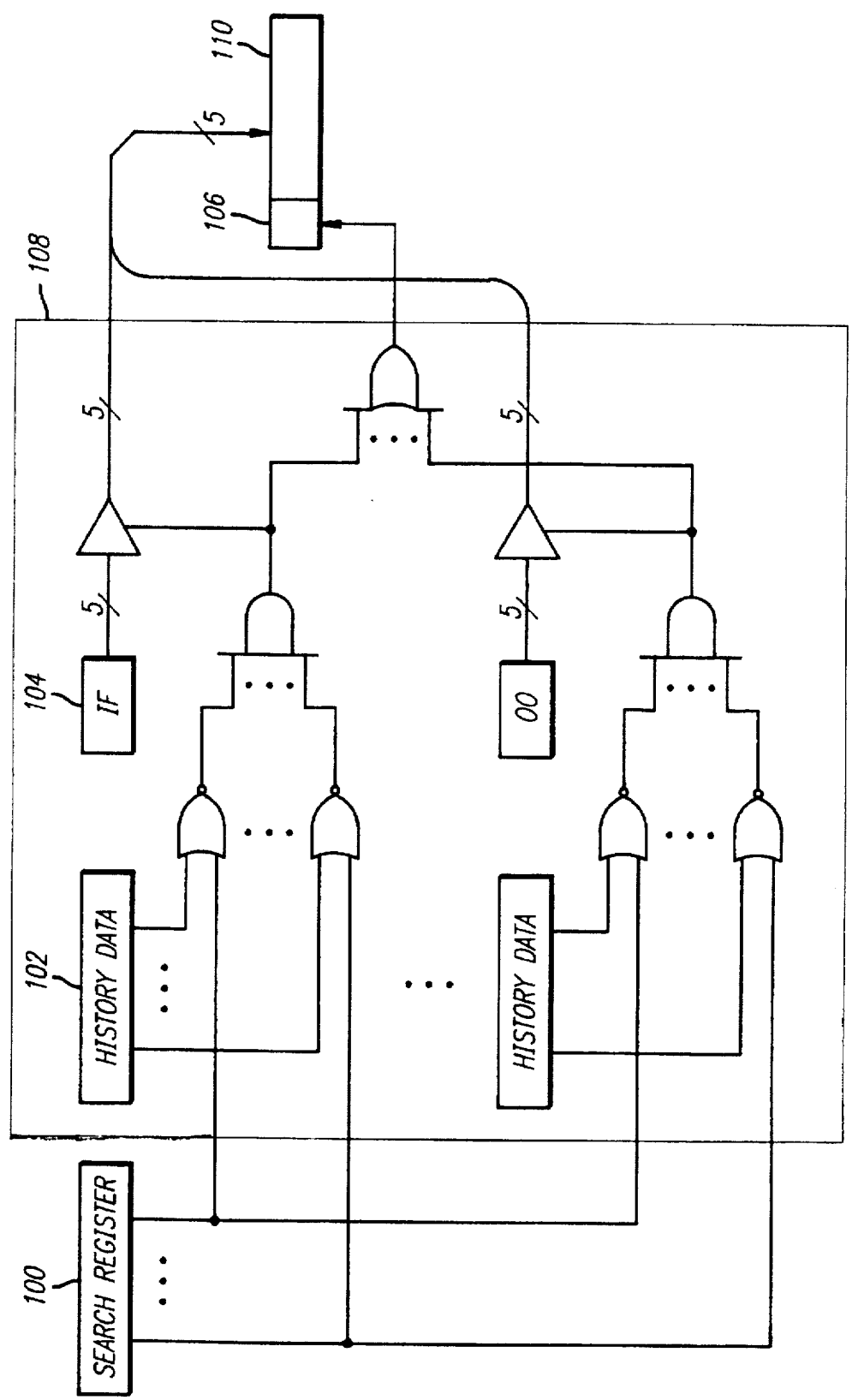
FIG. 11 illustrates a micro-table implemented in hardware, with a hardware comparator that searches all locations within the micro-table concurrently.

This method is shown in FIG. 11. The search value is loaded into search register 100 and simultaneously compared to the history data stored at each dictionary location within micro-table 108. If, for example, the search data matches the data stored at top location 102, then the corresponding 5-bit hardwired index value 1F (hex) within hardwired register 104 will be output onto the table_index bus. This 5-bit value, combined with a MSB 106 of 1, will become the 6-bit code value 110 output from the micro-table compressor.

Alternatively, the micro-table may be implemented in software. When the micro-table is implemented in software, a hash table may be used to increase the table search speed. A hash table is a Random Access Memory (RAM) wherein every possible data value that can be stored in the micro-table has a corresponding address within the hash table. For example, a 16-bit deep micro-table will require a hash table having 64k ($2^{16}$=65,536 locations) addresses.

If 16-bit data value 8373 (hex) is to be stored into location 1D (hex) into the micro-table, then the value 1D is stored at address 8373 within the hash table. The next time that the micro-table encoder performs a table search to see if the code value 8373 has been stored within the micro-table, it simply accesses address 8373 within the hash table.

The hash data at that address is 1D, so the encoder knows that the search data (8373) can be found at address 1D within the micro-table. Whenever a value is bumped off of the micro-table, the address within the hash table corresponding to the bumped data must be written to and an appropriate flag set at that location to indicate that the hash data at that location is no longer valid. Before the hash table is used, all locations must be initialized to a reserved value. This reserved value, when read by the micro-table compressor, denotes that no valid pattern equal to that hash table address has yet been stored in the micro-table.

Whenever a new compressed record is to be generated or transmitted, and a hash table is not being used, the micro-table must be initialized with an initialization value at each location before encoding can begin.

In the foregoing discussion, the micro-table mechanism of the present invention has been used for purposes of compression and decompression. However, as those skilled in the art will appreciate, the same mechanism may be applied in place of a least recently used (LRU) stack in numerous real-world applications. These include, but are not limited to, cache mechanisms such as disk caches and memory caches, LRU mechanisms which are used in other types of compressors and decompressors, and virtual memory mechanisms. The effect on the elements of the stack are slightly different from that of a typical LRU. However, many applications may benefit from the micro-table's simplicity which will result in a low cost of implementation in hardware or a high performance implementation in software.

D. Code Packer

Referring once more to FIG. 1, depending on the characteristics of the image being scanned and whether micro-table 24 has a sufficient data history built up within it, micro-table compressor 24 might actually expand the data from pairs-rep compressor 20 rather than compress it. Thus, it may be more efficient to disable micro-table 24. Also, where micro-table 24 is implemented in software, there will be an overhead associated with performing the micro-table compression.

Still further, in some systems in which data transfer times are already very high, micro-table 24 might not be required. For these reasons, it may actually improve total system throughput to disable micro-table 24 when compressing typical documents. But because there will be some pages that will not compress acceptably without micro-table phase 24, it should be selectable when needed.

Code packer 26 determines whether or not micro-table 24 will be enabled. In a hardware implementation as shown in FIG. 2, code packer 26 will either use the pairs-rep compressor 20 output, or will use the micro-table compressor 24 output. In a software implementation, code packer 26 will enable or disable the micro-table compressor 24.

There are various possible algorithms by which code packer 26 could operate. In a first method, code packer 26 will use the micro-table 24 output only if the compression ratio generated by the first two phases, 16 and 20, does not meet some pre-selected threshold level. At that point, since the page was complicated to compress, it is likely that rasterization was slow anyway so compression time will be less significant.

In a second method, code packer 26 will use the micro-table 24 output whenever the compression ratio generated by the first two phases, 20 and 16, is significantly different than for the previous band (indicating a change in the nature of the bitmap data). If it produces significant gains for the test band, then apply the final phase to subsequent bands as well. Other algorithms on which code packer 26 could operate will be obvious to those skilled in the art.

II. Decompression

Figure 12:
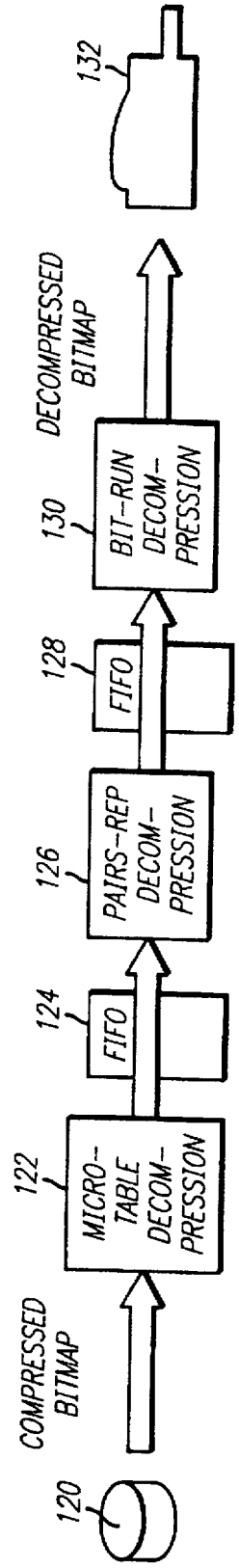
FIG. 12 illustrates a data decompressor according to the present invention.

Referring to FIG. 12, decompression according to the present invention is basically the inverse of compression. A data stream representing a compressed bitmap is received from a data source such as magnetic disk 120. The data is first decompressed by micro-table decompressor 122, then by pairs-rep decompressor 126, and finally by bit-run decompressor 130 before being passed to an output device such as laser printer 132. As with the compressor of FIG. 1, optional FIFO's 124 and 128 buffer the data between successive decompressor phases so as to eliminate latency and therefore increase throughput speed. The various phases of decompression are described more fully below.

A. Micro-Table Decompression

In micro-table decompression phase 122, the compressed data stream is processed in the same order it was output from the compressor and the data is parsed to distinguish match codes from literal values. As the data is processed, the table information is reconstructed so that the decompressor will know what pattern value should correspond to each possible input code value.

During micro-table decompression 122, the table is manipulated in much the same way as in compression. The primary difference is that each input value indicates directly if a match has occurred and, if so, at what table position (instead of requiring a search as in compression). If there is a table match, micro-table decompressor 122 updates the table the same way micro-table compressor 24 (FIG. 1) does for a match at the same position.

Likewise, for a table miss the bottom tier of the micro-table is updated with a MRU-add operation similar to the one performed during compression. By reproducing the table manipulations performed by micro-table compressor 24, micro-table decompressor 122 produces an equivalent table.

Therefore, when micro-table compressor 24 finds a match and outputs a code indicating the table position, micro-table decompressor 122 can find out what the matching pattern was by looking at that position in its own copy of the table.

There is one complication to micro-table decompression. When micro-table compressor 24 can not find a match for a pattern it only outputs a portion of that pattern as a literal value. The remainder is appended with additional data from the input data stream and the table is again searched.

Since literals only represent a portion of the original pattern, micro-table decompressor 122 can not immediately store the entire pattern in the MRU when a literal is encountered. Instead micro-table decompressor 122 waits until it receives the subsequent code or character which will reveal the remainder of the pattern to be added to the micro-table with the previous literal.

Alternatively, micro-table compressor 24 (FIG. 1) could be constructed such that the entire literal pattern is encoded in the compressor's output stream when a table miss occurs. In that case, the pattern would be immediately available to micro-table decompressor 122 and could therefore be added to the table as soon as it is received.

Figure 16:
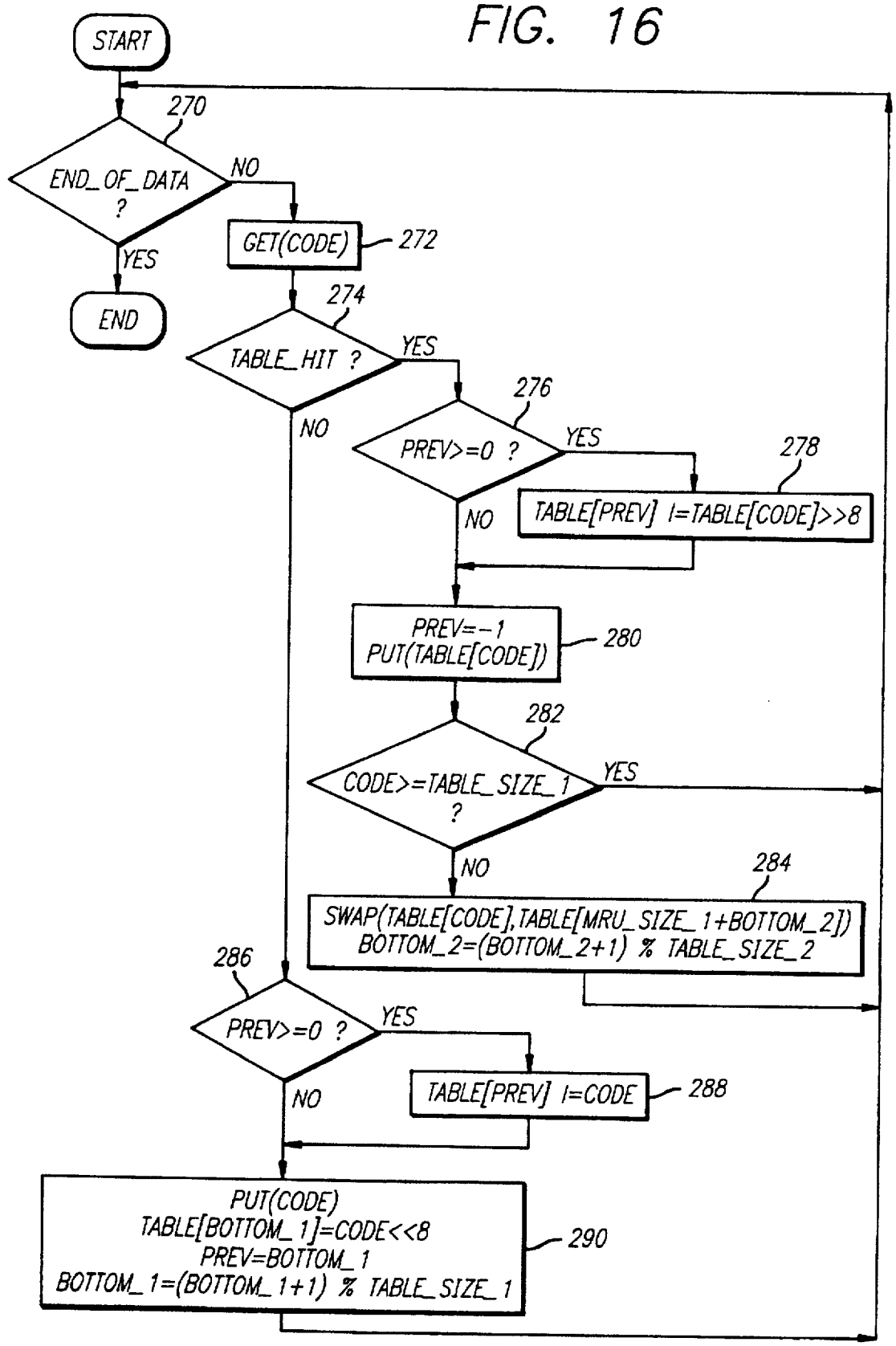
FIG. 16 depicts a software implementation of a micro-table decompression phase.

FIG. 16 depicts the software implementation of a micro-table decompressor have a two-tiered dictionary. A block of code is read in at block 272. If the code represents a table hit at block 274 (e.g., if MSB of code word 56 or 58 in FIG. 2 is a "1"), then control passes to block 276.

If the prior code had represented a table miss (i.e., flag prev had not been set to −1), then insert the code as the least significant byte of the top of the lower table at block 278; either way, output the hit element and set the prev flag to indicate a table hit. If the hit is within the top tier at block 282, then do nothing. If the hit is in the bottom tier at block, then move the hit element to the top of the top tier at block 284, and read in the next byte.

If, on the other hand, the code represents a table miss, then control passes to block 286. If the prior code had represented a table miss, then insert the code at the top of the lower table at block 288; either way, insert the code as the most significant byte of the top element in the lower table, at block 290, and read in the next byte.

B. Pairs-Rep Decompression

Pairs-rep decompressor 126 replicates the repeated pair the number of times specified by the count indicator. Non-repeating data is simply transferred to the output of the pairs-rep decompressor unaltered.

Figure 17:
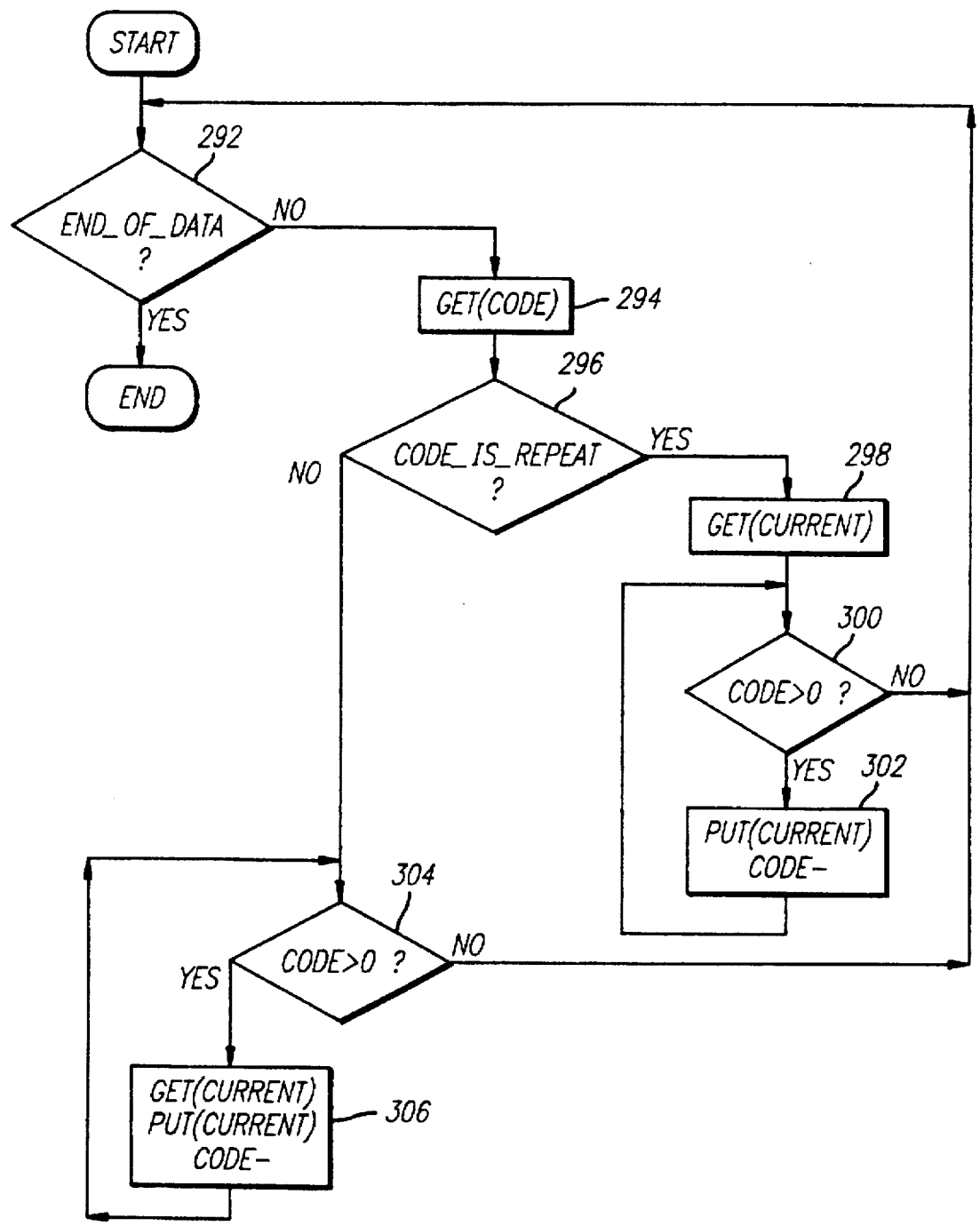
FIG. 17 depicts a software implementation of a pairs-rep decompression phase.

FIG. 17 depicts the software implementation of pairs-rep decompressor 126. The first code byte from a micro-table decompressor is read at block 294. If the code byte indicates that it represents repeated data at block 296 (e.g., if the code's MSB 44 is a "1" in FIG. 2) then the next byte (which is the repeated data) is read in at block 298, and is output at block 302 the appropriate number of times, where this number of times is specified by the 7 least significant bits (LSB's) of the first code byte, and counted down in block 300.

If the code byte indicates that the data to follow is literal data (e.g., if the code's LSB 44 is a "0" in FIG. 2), then the appropriate number of bytes is read and output at block 306, while block 304 counts down the literal data byte count.

C. Bit-Run Decompression

Bit-run decompressor 130 converts the stream of run length indicators from pairs-rep decompressor 126 into a stream of 1's and 0's. For each run count, that number of bits of the current polarity are output and the polarity is toggled. If the count is zero then the maximum run length is output and the polarity is not toggled.

Figure 18:
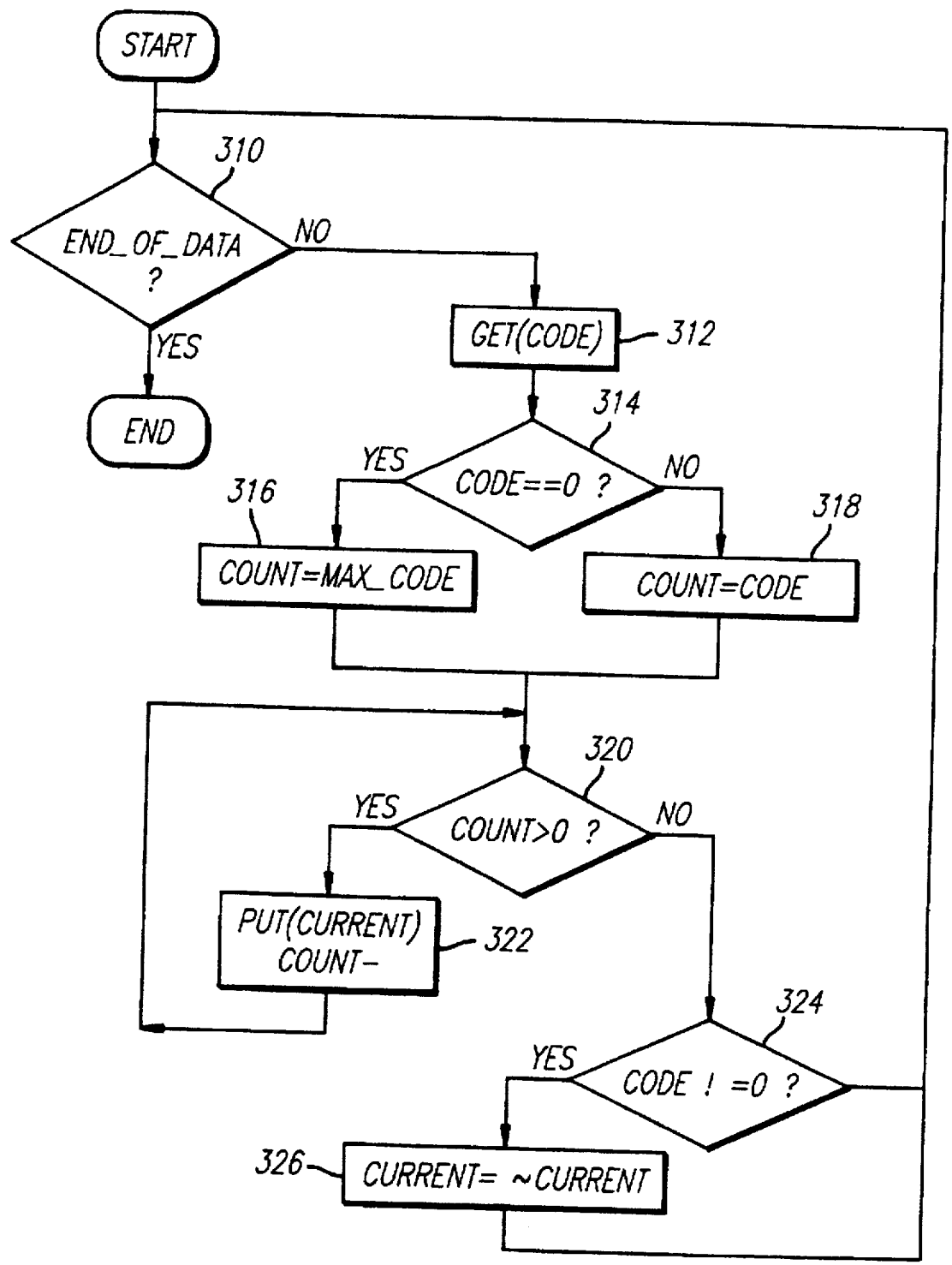
FIG. 18 depicts a software implementation of a bit-run decompression phase.

FIG. 18 depicts the software implementation of bit-run decompressor 130. A nibble of code is read in at block 312. If the code nibble is not 0, then the run length is the value of the nibble, at block 318; if the nibble is equal to 0, then the run length is greater than 15 and continues to the next nibble, at 316.

At blocks 320 and 322, a "1" or a "0" is output the number of times equal to the run length. At block 324, if the code was not equal to 0 (data run does not continue to the next nibble) then the polarity of the output bit is changed from 0 to 1, or vice versa. The process then starts over again at block 310 for the next nibble.

The invention has been described with reference to monochrome image data, comprising a stream of bits that represent black bits and white bits. However, the present invention is in no way limited to the compression and decompression of monochrome image data.

A stream of bitmap data may be used not only to represent black-and-white pixel data, but may also represent one channel of color pixel data, such as one component of RGB color data or one component of luminance/chrominance color data, with corresponding increases in storage or transmission efficiencies.

The invention has been also described with reference to a dictionary having elements of fixed length of 16 bits. However, dictionaries may be constructed which encode variable length strings. For example, U.S. Pat. No. 5,179,378, issued to Ranganathan et al., discloses one method of using code words to represent data strings within a dictionary table, where the data strings encoded are of variable length. As those skilled in the art will appreciate, many such variable length encoding techniques may be used in combination with the present invention.

Although the present invention has thus been described in detail with regard to the preferred embodiments and drawings thereof, it should be apparent to those skilled in the art that various adaptations and modifications of the present invention may be accomplished without departing from the spirit and the scope of the invention.

Accordingly, it is to be understood that the detailed description and the accompanying drawings as set for hereinabove are not intended to limit the breadth of the present invention, which should be inferred only from the following claims and their appropriately construed equivalents.

We claim:

1. A method of compressing a binary input data stream comprised of binary bits, comprising the steps of:

(a) bit-run encoding the binary input data stream to produce a first compressed data stream, the bit-run encoding step comprising the substeps of:
- (a1) replacing a first run comprising a number of consecutive identical bits in the input data stream, with a first symbol representing a number of bits in the first run; and
- (a2) replacing a second run comprising a number of consecutive identical bits in the input data stream, with a second symbol representing a number of bits in the second run, the second run immediately following the first run within the input data stream, the second run having bits of opposite polarity from the bits in said first run; and (b) pairs-rep compressing the first compressed data stream to produce a second compressed data stream, the pairs-rep compression step comprising the substeps of:
- (b1) identifying a consecutively repeating pair of symbols in the first compressed data stream;
- (b2) determining a number of times the pair of symbols consecutively repeats; and
- (b3) generating a first set of values corresponding to the repeating symbol pair and the number of times the symbol pair repeats.

2. A method as in claim 1, wherein:
the first symbol produced in substep (a1) does not include an example of the bits within said first run; and
the second symbol produced in substep (a2) does not include an example of the bits within said second run.

3. A method as in claim 1, further comprising the step of:
(c) compressing the second compressed data stream using dictionary-based compression to produce a third compressed data stream, the dictionary-based compression step comprising the substeps of:
- (c1) storing a dictionary element in a location within the dictionary, the dictionary element corresponding to the first set of values;
- (c2) generating an index corresponding to the location; and
- (c3) replacing said first set of values in the second compressed data stream with said index.

4. A method as in claim 3, wherein:
said dictionary elements within said dictionary are a maximum of 32 in number.

5. A method as in claim 3, wherein the dictionary comprises a stack coming a plurality of said dictionary elements and a pointer indicating a lowest priority element in the stack, and wherein the stack is updated according to the steps of:

- (d1) demoting elements in the stack by replacing the lowest priority element with a most recently used element; and
- (d2) advancing the pointer.

6. A method as in claim 3, wherein the dictionary is a multi-tiered stack, the multi-tiered stack comprising a first sub-stack and a second sub-stack, each sub-stack including an identified lowest priority element therein, and wherein the stack is updated according to the steps of:

- (e1) upon an occurrence of a first dictionary element being detected in said second compressed data stream, promoting said first element by moving said first element from said first sub-stack to said second sub-stack; and
- (e2) when said first element is the lowest priority element within said second sub-stack, upon the occurrence of a second element being promoted from said first sub-stack to said second sub-stack, demoting said first element by moving said first element from said second sub-stack to said first sub-stack.

7. A method as in claim 3, wherein the dictionary is a multi-tiered stack, the multi-tiered stack comprising first, second and third sub-stacks; each sub-stack including an identified lowest priority element therein; said first, second and third sub-stacks being defined as from lowest to highest respectively; and wherein the stack is updated according to the steps of:

- (e1) when a first dictionary element is located in a lower sub-stack, upon an occurrence of said first dictionary element being detected in said second compressed data stream, promoting said first element by moving said first element from the lower sub-stack to a higher sub-stack; and
- (e2) when said first element is a lowest priority element within a higher sub-stack, upon the occurrence of a second element being promoted from said lower sub-stack to said higher sub-stack, demoting said first element by moving said first element from said higher sub-stack to said lower sub-stack.

8. A method as in claim 7, wherein:
said first sub-stack contains 8 dictionary elements;
said second sub-stack contains 8 dictionary elements; and
said third sub-stack contains 16 dictionary elements.

* * * * *